Feb. 6, 1968 E. F. PASIERB 3,368,125

SEMICONDUCTOR GALLIUM ARSENIDE WITH GERMANIUM CONNECTING LAYER

Filed Aug. 25, 1965

INVENTOR.
EDWARD F. PASIERB
BY
[signature]
Attorney 3,368,125

SEMICONDUCTOR GALLIUM ARSENIDE WITH GERMANIUM CONNECTING LAYER

Edward F. Pasierb, Trenton, N.J., assignor to Radio Corporation of America, a corporation of Delaware Filed Aug. 25, 1965, Ser. No. 482,571
3 Claims. (Cl. 317—237)

This invention relates to an improved semiconductor device of the type wherein a polycrystalline layer of semiconductor constitutes an active portion. The device has particular application as a solar cell but it is not limited to such use. This invention also relates to a method of fabricating the above mentioned type of device, in which a low resistance ohmic contact is established between the semiconductive material and a suitable substrate.

There are several presently known types of semiconductive devices for converting solar energy into electrical energy. One of these types comprises a conductive substrate, a layer of polycrystalline semiconductive material thereon, and a thin film of conductive material on the semiconductive material. The materials are so chosen that the interface between the conductive film and the semiconductor layer is a rectifying barrier. The conductive film is made thin enough to be semi-transparent to sunlight. This type of cell, which is also called a photovoltaic cell, generates electron-hole pairs when light passes through the thin conductive film and strikes the barrier layer between the conductive film and the semiconductor. An electrical current flows when the cell is connected in a circuit.

In the above described type of device, it is necessary that there be a good low resistance ohmic contact between the semiconductor material and the substrate.

Although there are many different semiconductor materials from which photovoltaic type solar cells can be made, gallium arsenide is one of the preferred materials because of its high sensitivity to the energy in the solar spectrum. Theoretically, then, its maximum attainable efficiency is also high and the amount of output current per unit of cell area is relatively high.

It is possible to prepare single crystal bodies of gallium arsenide but it has proved to be difficult and expensive to prepare large crystals of the material. It is therefore expensive and difficult to make large-area single-crystal photocells of this semiconductor. On the other hand, it is much easier to deposit polycrystalline layers of gallium arsenide onto suitable substrates and, if polycrystalline material can be successfully used for the cells, large area cells can be made at relatively low cost.

In the past, one of the difficulties in the way of producing low cost, large area photocells made of polycrystalline gallium arsenide has been the difficulty of making a good, low resistance ohmic contact to a suitable metallic substrate while maintaining the desired semiconductive properties of the gallium arsenide layer.

One object of the present invention is to provide an improved semiconductor device of the type wherein the semiconductor is a polycrystalline layer of gallium arsenide.

Another object of the invention is to provide a method of fabricating an improved device of the above-described type.

A more specific object of the invention is to provide a device of the above-described type with an improved low resistance ohmic contact between N-type polycrystalline gallium arsenide and a molybdenum substrate.

Briefly, the improved device of the present invention includes a substrate which is preferably a sheet of molybdenum, a layer of tin on the molybdenum substrate, a layer of germanium on the tin layer, a layer of polycrystalline N-type gallium arsenide on the germanium layer, and a semi-transparent conducting layer on the gallium arsenide. The tin provides a good, low resistance ohmic contact to the molybdenum substrate. But it can seriously affect the semiconductive properties of the gallium arsenide by diffusion and migration along the grain boundaries of the semiconductor. The layer of germanium inhibits migration of the tin into the gallium arsenide but, alone, it would not provide a good low resistance ohmic contact between the molybdenum and gallium arsenide. Germanium also provides a good surface for nucleating the GaAs film and it does not adversely affect the properties of the deposited N-type gallium arsenide film.

Figure 1:
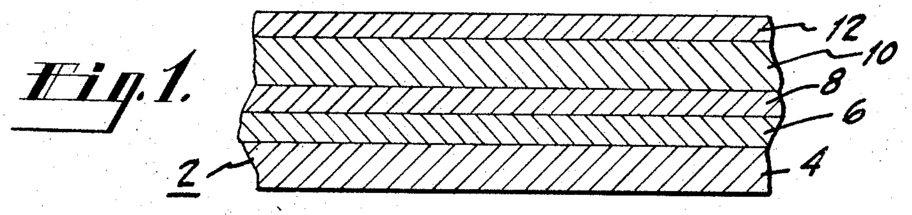
FIGURE 1 is a cross-section view of a part of a device in accordance with the present invention.

Referring now to FIGURE 1, a photovoltaic cell made in accordance with the invention may include a conductive substrate 4 comprising a thin sheet of molybdenum. Molybdenum is a desirable metal to use for this purpose because it has a coefficient of expansion about the same as that of gallium arsenide. On the molybdenum substrate is a thin layer of tin 6. A layer of germanium 8 is superimposed on the tin layer 6. A polycrystalline layer of N-type gallium arsenide 10 is on top of the germanium layer 8 and, finally, a thin semi-transparent layer of platinum 12 is on top of the layer 10 of gallium arsenide. A completed device also includes lead wires (not shown) attached to the substrate 4 and the top layer 12.

Figure 2:
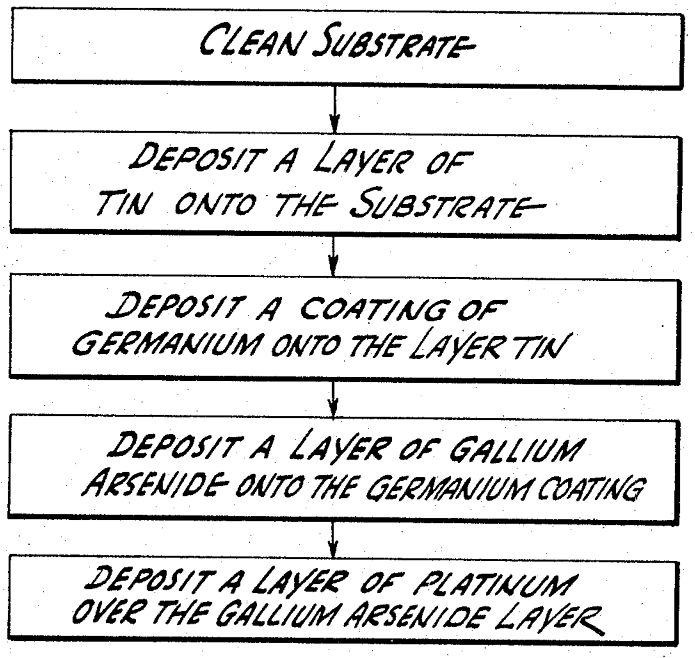
FIGURE 2 is a flow-chart showing various steps in an embodiment of the improved method of making a device of the present invention.

An example of an embodiment of the method of the present invention will now be given. The principal steps of the method are illustrated in the flow chart of FIGURE 2. A thin sheet of molybdenum is cleaned with ammonium hydroxide and then dried with alcohol. The next step is the deposition of a layer of tin onto the molybdenum substrate. This may be carried out in a conventional vacuum chamber apparatus. The tin layer may have a thickness of about 200 angstroms but the thickness is not very critical. Thicknesses between about 40 angstroms and about 1500 angstroms have been found to be acceptable.

The next step is to vacuum-evaporate a layer of germanium onto the surface of the tin layer. Although the germanium, as deposited in this manner, is usually amorphous, it could just as well be crystalline. The germanium layer may, for example, be between about 40 and 150 angstroms in thickness.

Next, a layer of polycrystalline N-type gallium arsenide is deposited over the germanium. Although, once more, the thickness of the layer is not very critical, it may conveniently have a thickness of about 3 mils. It could be considerably thinner or thicker than this. Greater thicknesses are not necessary.

Figure 3:
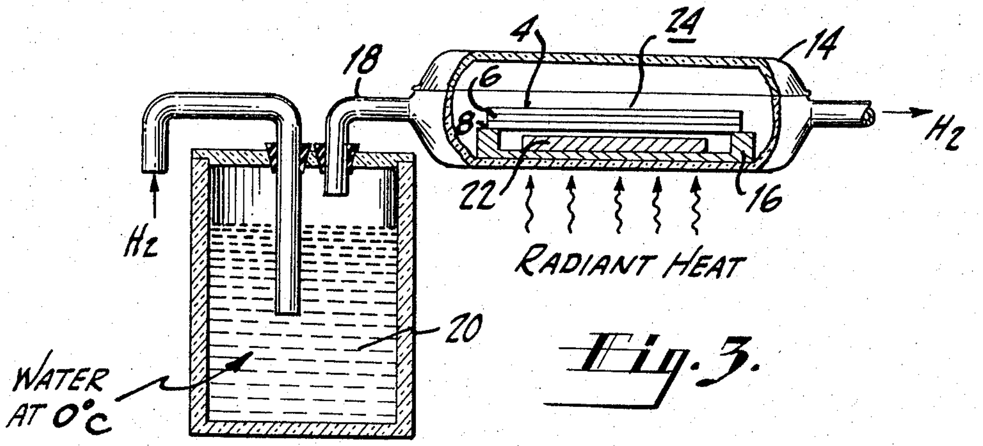
FIGURE 3 is a partially schematic view of apparatus that may be used in carrying out part of the method of the present invention.

One form of apparatus that may be used for carrying out the deposition of the layer of gallium arsenide is illustrated in FIGURE 3. This apparatus may include a furnace tube 14 made of quartz, within which is a graphite heater boat 16. The graphite boat is heated by directing the rays from heat lamps (not shown) onto it through the bottom wall of the furnace tube. One end of the furnace tube 14 is connected to a gas inlet line 18. The gas inlet line includes a bubbler chamber 20.

A layer of gallium arsenide is deposited as follows. A "source" crystal of gallium arsenide 22 is placed in the heater boat 16. Then a piece of molybdenum sheet 24 on which a layer of tin and a layer of germanium have already been deposited is placed over the top of the boat 16 with the germanium side down. Close spacing, for example 0.02 inch, is maintained between the germanium surface and the gallium arsenide source crystal.

Gallium arsenide is carried from the source crystal to the germanium layer by a vapor transport method. In this case the method is carried out by passing hydrogen gas into the furnace tube 14 from the inlet tube 18 after the hydrogen has first picked up water vapor at 0° C. in the water bubbler 20. The graphite boat is maintained at a temperature of about 700° C. to about 900° C. and the coated substrate 24 is at a somewhat lower temperature. Gallium is transported from the source crystal to the coated substrate as the oxide while the arsenic is transported as the arsenic vapor. The gallium oxide and the arsenic react to produce gallium arsenide which deposits as a polycrystalline layer. Under these conditions the gallium arsenide is deposited as N-type although no doping impurities are intentionally added to the system.

After a suitable thickness of gallium arsenide has been deposited, a semi-transparent layer of platinum is deposited on the gallium arsenide surface. The thickness of this layer may be about 40 angstroms, for example. If too thin a layer is deposited, the resistance of the layer will be too high for efficient operation of the device. The platinum may be deposited by any conventional method such as vacuum evaporation or electroplating.

Although platinum has been given as an example of a suitable metal for the thin, semi-transparent conducting film, other metals, such as gold, may be used.

Although the device has thus far been described as a solar cell, it could also be used as a rectifier of alternating current. In that case the conducting film 12 can be made much thicker since it need not be made thin enough to transmit light.

What is claimed is:

1. A device comprising:
a molybdenum substrate;
a layer of tin on said substrate forming a low resistance contact therewith;
a layer of germanium on said tin layer;
a layer of polycrystalline N-type gallium arsenide on said germanium layer; and
a layer of conducting material on said gallium arsenide layer making a rectifying contact therewith.

2. A device according to claim 1 in which said layer of conducting material is semi-transparent to sunlight.

3. A device according to claim 2 in which said layer of conducting material is composed of platinum.

References Cited

UNITED STATES PATENTS

| | | | |
|---|---|---|---|
| 2,937,324 | 5/1960 | Kroko | 317—234 |
| 3,049,622 | 8/1962 | Ahlstrom et al. | 317—234 X |
| 3,159,462 | 12/1964 | Kadelburg | 317—234 |
| 3,319,068 | 5/1967 | Beale et al. | 317—234 X |

JAMES D. KALLAM, *Primary Examiner.*